United States Patent
Kartadinata et al.

(10) Patent No.: US 12,200,891 B2
(45) Date of Patent: Jan. 14, 2025

(54) SIDE-MOUNTED LOCK FOR HBA CARD

(71) Applicant: Hewlett Packard Enterprise Development LP, Houston, TX (US)

(72) Inventors: Warren A. Kartadinata, Fremont, CA (US); Neil Jefferson Asmussen, Houston, TX (US); Vance B. Murakami, Los Gatos, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 289 days.

(21) Appl. No.: 17/752,630

(22) Filed: May 24, 2022

(65) Prior Publication Data
US 2023/0389211 A1  Nov. 30, 2023

(51) Int. Cl.
*H05K 7/14* (2006.01)

(52) U.S. Cl.
CPC .................................. *H05K 7/1405* (2013.01)

(58) Field of Classification Search
CPC .. H05K 7/1405; H05K 7/1418; H05K 7/1409; H05K 7/1489; H05K 7/16; H05K 5/0221; H05K 9/0007; H05K 7/1488; H01R 12/7011; H01R 12/70; H01R 13/639
See application file for complete search history.

(56) References Cited

U.S. PATENT DOCUMENTS

| | | | | |
|---|---|---|---|---|
| 8,390,601 B2* | 3/2013 | Liang | ................... | G06F 3/03545 |
| | | | | 361/679.01 |
| 2003/0099096 A1* | 5/2003 | Megason | ............. | H05K 7/1405 |
| | | | | 361/759 |
| 2010/0214749 A1* | 8/2010 | Lee | ....................... | H05K 7/1404 |
| | | | | 361/754 |
| 2019/0044262 A1* | 2/2019 | Geng | ................... | H01R 12/737 |
| 2021/0112674 A1* | 4/2021 | Ehlen | ................... | H05K 5/0026 |

FOREIGN PATENT DOCUMENTS

CN          105937533 A    9/2016

OTHER PUBLICATIONS

Fivetech Technology Inc., "Rotate Ejector—Mini Latch Plunger," Feb. 2, 2018, Product literature, 1 page.
Southco, "56 Spring-Loaded Plunger Flare-in-style—Miniature, Small and Large", Product literature, Oct. 2, 2019, 6 pages.

* cited by examiner

*Primary Examiner* — James Wu
*Assistant Examiner* — Dakota M Talbert
(74) *Attorney, Agent, or Firm* — Yao Legal Services, Inc.

(57) ABSTRACT

One aspect of the instant application provides an apparatus for locking a circuit board in position. The apparatus can include a cam latch, a plunger, and a hinge pin coupling the cam latch and the plunger. The cam latch is positioned to rotate around the hinge pin, and the rotation of the cam latch causes a linear motion of the plunger in a plane parallel to a component-mounting surface of the circuit board, thereby facilitating locking and unlocking of the circuit board.

18 Claims, 8 Drawing Sheets

SIDE-MOUNTED LOCK FOR HBA CARD

BACKGROUND

This disclosure is generally related to a locking mechanism for locking circuit cards in position. More specifically, the locking mechanism can be side mounted and based on a cam latch.

BRIEF DESCRIPTION OF THE FIGURES

In the figures, like reference numerals refer to the same figure elements.

DETAILED DESCRIPTION

The following description is presented to enable any person skilled in the art to make and use the examples and is provided in the context of a particular application and its requirements. Various modifications to the disclosed examples will be readily apparent to those skilled in the art, and the general principles defined herein may be applied to other examples and applications without departing from the spirit and scope of the present disclosure. Thus, the scope of the present disclosure is not limited to the examples shown but is to be accorded the widest scope consistent with the principles and features disclosed herein.

The ever-increasing computing and storage demands have led to the continuous growth of component density in computer servers, and there is progressively less space to install add-in cards and devices that may be necessary for a specific application. For example, a chassis may use input/output modules (IOMs) to meet the input/output needs of the storage nodes mounted on the chassis, and each IOM may require up to four hot-swappable host bus adaptor (HBA) cards, which connect host systems to corresponding storage devices. Because the IOM is typically placed in a 1U enclosure, the four HBA cards cannot fit on the same plane. One solution is to stack two HBA cards together (i.e., by placing one HBA card on top of another). However, this HBA-stacking configuration presents a challenge for enabling hot swapping of the HBA cards, because conventional mechanisms for locking and unlocking the HBA cards are top-mounted. When multiple (e.g., two) host bus adaptor (HBA) cards are stacked in a 1U input/output module (IOM), the conventional top-mounted locking mechanism can no longer be applied.

The present disclosure describes a solution for locking circuit boards in position between a pair of guide rails. The proposed internal locking mechanism can be mounted on the side of one of the pair of guide rails holding the stacked HBA cards. The internal lock can include a cam latch, a plunger, and a hinge pin coupling the cam latch and the plunger. When the HBA card is inserted into a slot on the guide rail, the tip of the plunger can retract into a through-hole on the guide rail and then return into a notch on the HBA card, locking the HBA card in position. The cam latch can rotate about the hinge pin, and the rotational motion of the cam latch can be transformed into a linear motion of the plunger. Therefore, one can rotate the cam latch to pull the plunger out of the notch on the HBA card, thus allowing the HBA card to be removed.

Figure 1:
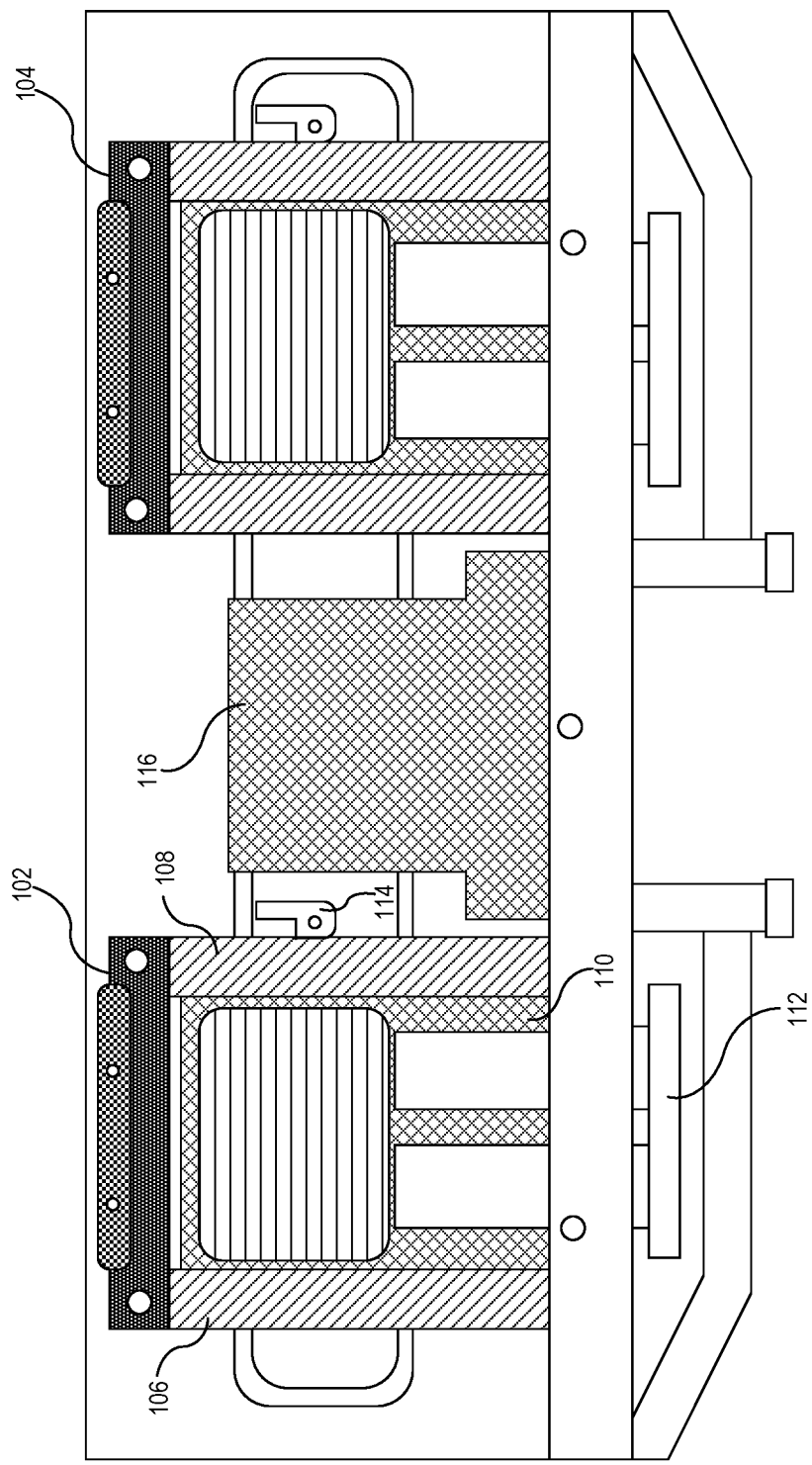
FIG. 1 presents a diagram illustrating a partial top view of an input/output module (IOM) with a side-mounted locking mechanism, according to one aspect of the application.

FIG. 1 presents a diagram illustrating a partial top view of an input/output module (IOM) with a side-mounted locking mechanism, according to one aspect of the application. In FIG. 1, an IOM 100 can include a pair of HBA sub-assemblies 102 and 104. Each enclosure can include a pair of guide rails for holding one or more HBA cards. For example, HBA sub-assembly 102 can include guide rails 106 and 108 that hold a number of HBA cards, including HBA card 110. Note that additional HBA cards can be placed below HBA card 110 and are not shown in FIG. 1. FIG. 1 also shows that each HBA card can be coupled to a handle for pushing or pulling the HBA card along the guide rails when replacing the HBA card. For example, HBA card 110 can be coupled to a handle 112, which can pull HBA card 110 out of HBA sub-assembly 102 from the front of IOM module 100 when replacing HBA card 110.

Because the HBA card can slide along the guide rails to facilitate the hot swapping or service operation, a locking mechanism can be used to lock the HBA card in position when it is in service. In conventional systems where the HBA cards are on the same plane and not stacked, a locking mechanism can be mounted above the HBA card to lock the HBA card (e.g., via a notch on the HBA card) in position. However, when multiple HBA cards are stacked, the top-mounted locking mechanism may no longer be applicable. More specifically, given the limited vertical spacing of the 1U IOM chassis (which can be, in one example, approximately 38.7 mm considering the sheet metal thickness of the top and bottom covers of the IOM chassis) within which the stacked HBA cards are placed, a top-mounted locking mechanism may not fit in the 1U IOM chassis.

To facilitate locking/unlocking of the stacked HBA cards, a side-mounted locking mechanism can be applied to access and lock each stacked HBA card from the side. Each HBA sub-assembly can include locks attached to the side of its guide rail. Multiple locks can be attached to the guide rail, one lock per HBA card. For example, FIG. 1 shows a side-mounted lock 114 attached to the side of guide rail 108 of HBA sub-assembly 102. Side-mounted lock 114 can lock HBA card 110 in position such that, when locked, HBA card 110 can be prevented from sliding along the guide rails 106 and 108. According to one aspect, to pull HBA card 110 from enclosure 102, a user can open the top cover of IOM 100 to place side-mounted lock 114 in an unlocked state.

FIG. 1 also shows a circuit board 116 positioned between HBA sub-assemblies 102 and 104. Because circuit board 116 is typically not hot swappable, its position can be fixed, and an additional locking mechanism might not be necessary. Note that FIG. 1 only shows a portion of components within IOM 100. Additional components, such as the motherboard, are not shown.

Figure 2B:
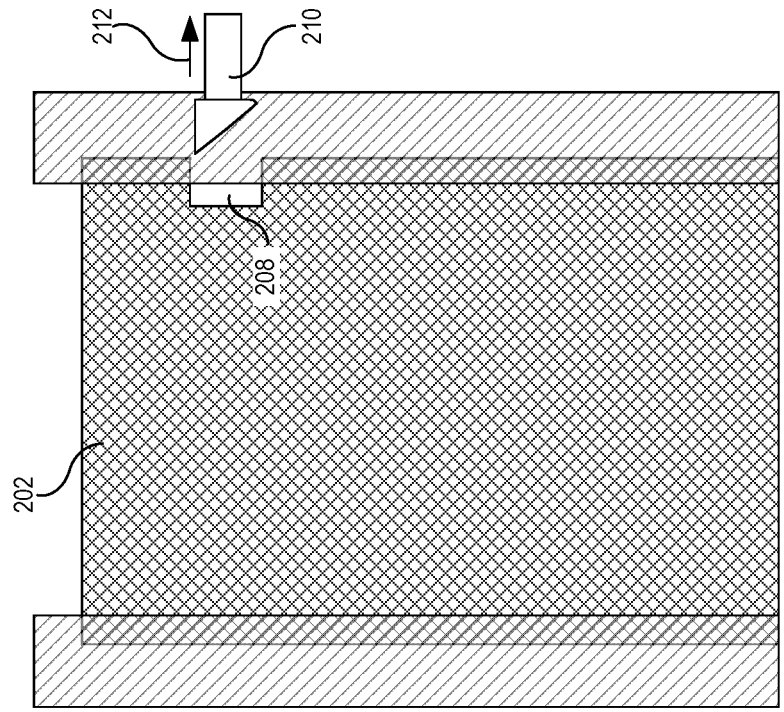
FIGS. 2A-2B illustrate the operation principle of a side-mounted locking mechanism, according to one aspect of the application.
Figure 2A:
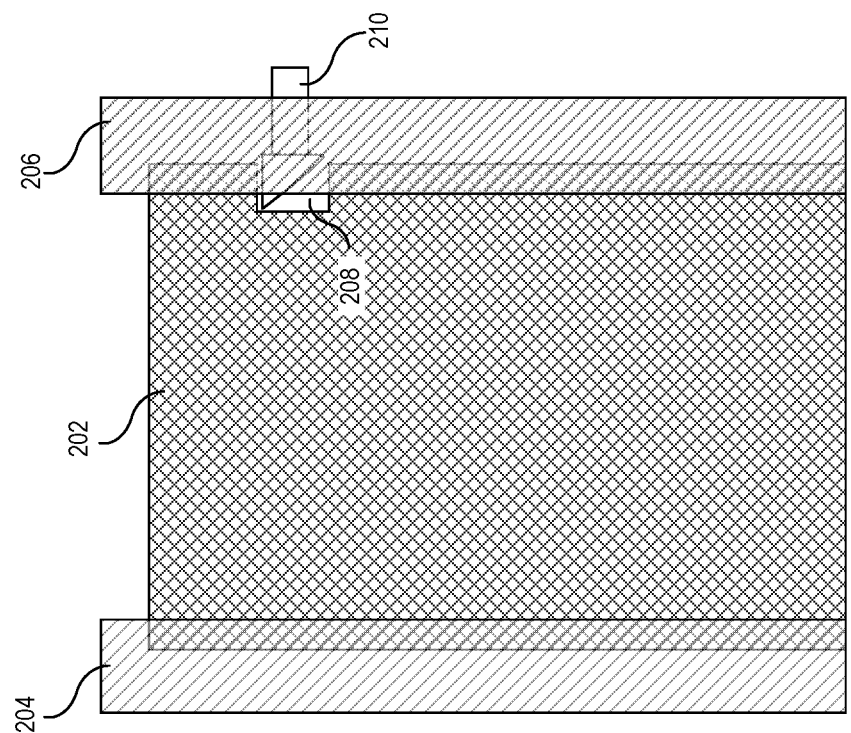

FIGS. 2A-2B illustrate the operation principle of the locking mechanism, according to one aspect of the application. More specifically, FIG. 2A and FIG. 2B each show the top view of the HBA sub-assembly comprising the HBA card and the guide rails. According to one aspect, the HBA card can comply with the Open Compute Project (OCP) standard. For example, an OCP HBA card can have a well-defined dimension such as 16.8 cm×6.9 cm. FIG. 2A shows an OCP HBA card 202 positioned between guide rails 204 and 206. Each of the guide rails can include a slot, allowing a corresponding edge of OCP HBA card 202 to be inserted in the slot. OCP HBA card 202 can then slide along the guide rails, thus facilitating hot swapping of HBA card 202. FIG. 2A also shows that HBA card 202 includes, on one of its longer edges, a notch 208. The location and size of notch 208 can be based on the OCP standard. The tip of a plunger 210 can be inserted, via a through-hole (not shown in FIG. 2A) on guide rail 206, into notch 208. Because plunger 210 is constrained by the through-hole on guide rail 206, when its tip is inserted into notch 208, HBA card 202 can be locked in position and prevented from sliding along the guide rails.

Although plunger 210 cannot move along the longitudinal direction of guide rail 206, it can move in a perpendicular direction. FIG. 2B shows that plunger 210 can move to the right, as shown by an arrow 212, causing the tip of plunger 210 to retract from notch 208. When plunger 210 is retracted, HBA card 202 is free to move along the guide rails. According to some aspects, movement of plunger 210 can be confined to a plane parallel to the component-mounting surface of HBA card 210, as indicated by arrow 212.

There can be various mechanisms that can be used to push and pull the plunger in and out of the notch on the HBA card in order to lock and unlock the HBA card. Some mechanisms, such as a push-pull lever, can be bulky or hard to operate. According to some aspects of the instant application, a compact cam latch can be used to push or pull the plunger. More specifically, the plunger and cam latch can be coupled in such a way that rotational motions of the cam latch can be transformed to linear motions of the plunger, resulting in the plunger moving in and out of the notch on the HBA card.

Figure 3A:
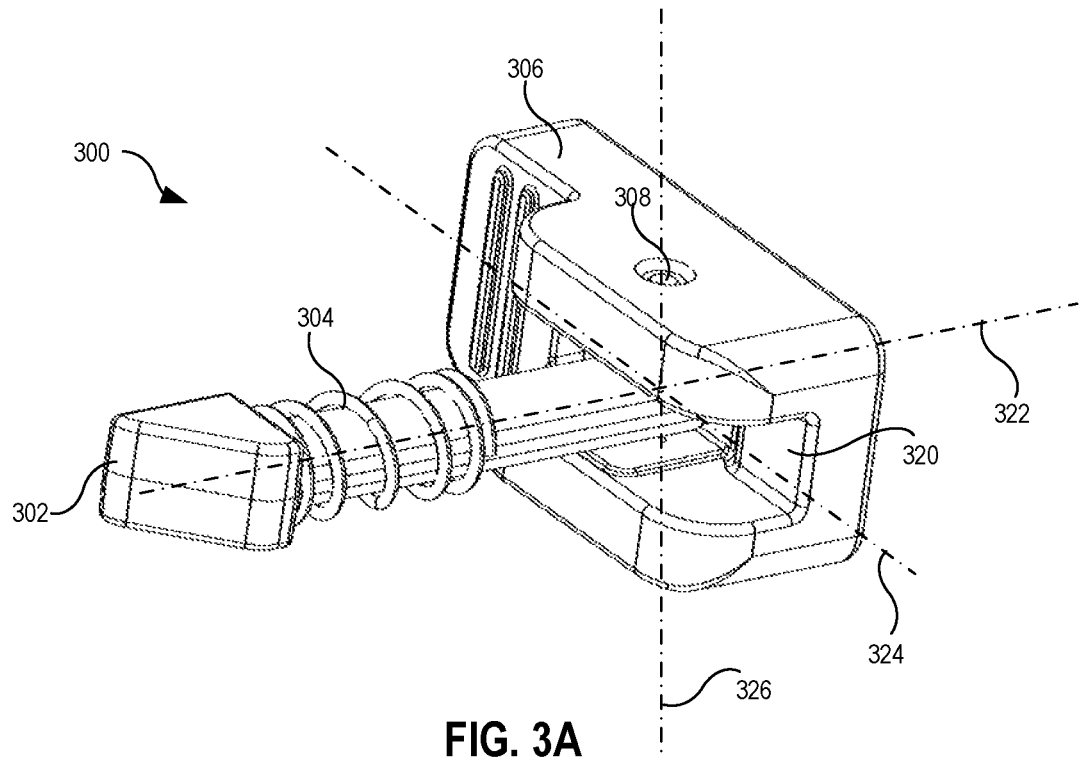
FIG. 3A illustrates a side-mounted lock for locking a circuit board in position, according to one aspect of the instant application.

FIG. 3A illustrates a side-mounted lock for locking a circuit board in position, according to one aspect of the instant application. In this example, a lock 300 can include a plunger 302, a spring 304, a cam latch 306, and a hinge pin 308. FIG. 3A shows that cam latch 306 can include a slot 320 to allow plunger 302 to be inserted into slot 320 and be coupled to cam latch 306 via hinge pin 308. FIG. 3A also shows that a longitudinal axis 322 of plunger 302, a longitudinal axis 324 of cam latch 306, and a longitudinal axis 326 of hinge pin 308 intersect and are perpendicular to each other. This way, plunger 302 and cam latch 306 can each rotate around hinge pin 308.

Figure 3B:
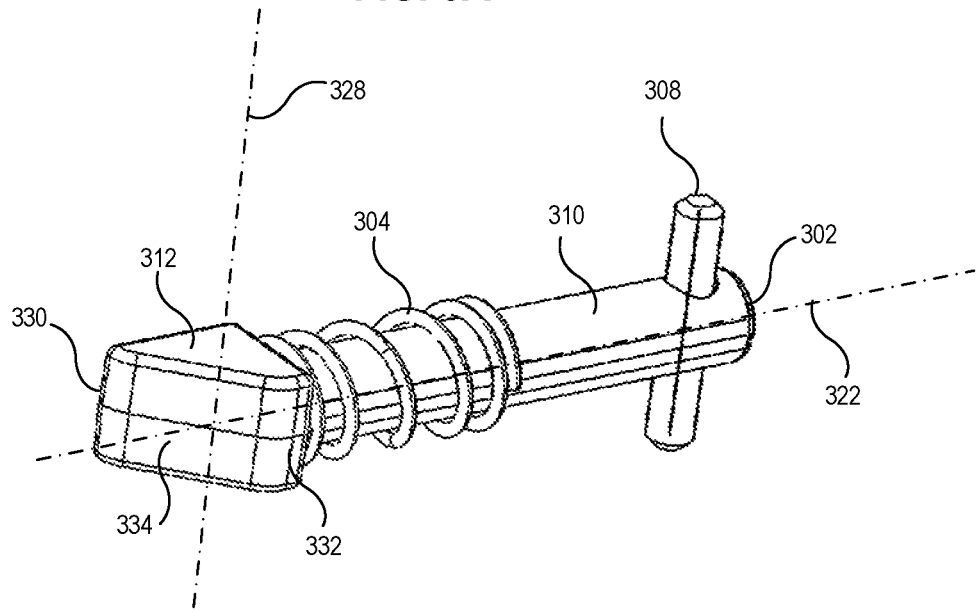
FIG. 3B illustrates a plunger and a hinge pin of the side-mounted lock, according to one aspect of the instant application.

FIG. 3B illustrates a plunger and a hinge pin of the side-mounted lock, according to one aspect of the instant application. In FIG. 3B, plunger 302 can include a rod 310 and a lock feature 312. Spring 304 surrounds rod 310. According to one aspect, rod 310 can be cylindrical and lock feature 312 can have a shape of a right triangular prism. Longitudinal axis 322 of rod 310 and a longitudinal axis 328 of lock feature 312 can be perpendicular to each other. According to a further aspect, the right triangular prism can have rounded or chamfered edges 330 and 332, such that when an HBA card is pushed along the guide rails, the edge of the HBA card can move along a slanted surface 334 of lock feature 312 with relative ease, pushing lock feature 312 toward the guide rail to allow passage of the HBA card. For example, an average user is able to push the HBA card in position by applying a force of a few newtons (e.g., between 5 and 10 N) on the HBA card. When lock 300 is installed on the guide rail, slanted surface 334 of lock feature 312 faces an incoming direction of the to-be-installed circuit board (i.e., the front of the HBA sub-assembly). When the HBA card is pushed to a position where the notch is aligned with lock feature 312, spring 304 can push lock feature 312 into the notch, locking the HBA card in position. The dimensions of lock feature 312 can be configured such that lock feature 312 can fit in the notch on the OCP HBA circuit board. According to one aspect, plunger 302 can be made of metal, such as die-cast aluminum, die-cast zinc, etc. FIG. 3B also shows hinge pin 308 inserted into a cavity on rod 310. The cavity can be configured such that hinge pin 308 is oriented perpendicular to longitudinal axis 322 of rod 310. According to one aspect, hinge pin 308 can also be made of metal (e.g., steel, stainless steel, etc.).

Figure 3C:
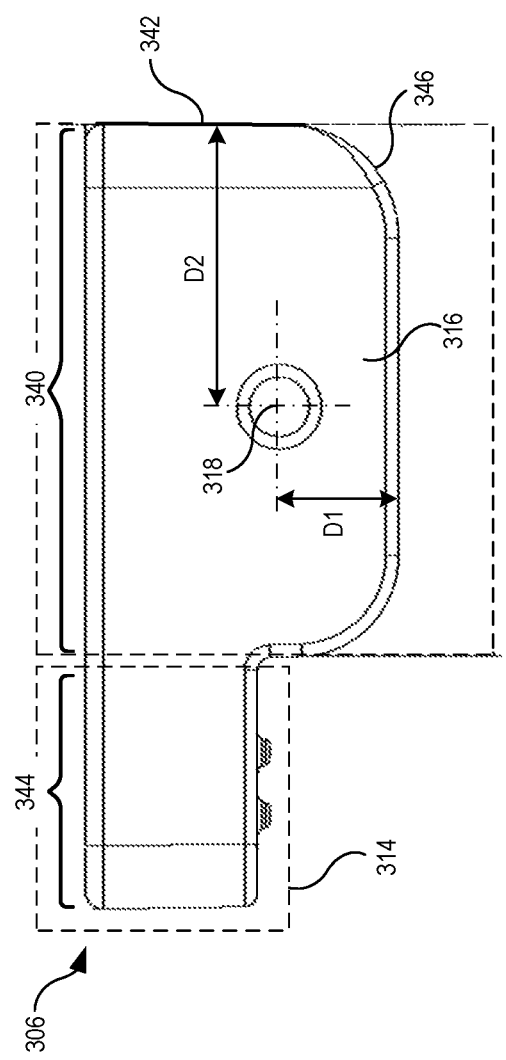
FIG. 3C illustrates a top view of a cam latch of the side-mounted lock, according to one aspect of the instant application.

FIG. 3C illustrates a top view of a cam latch of the side-mounted lock, according to one aspect of the instant application. Cam latch 306 can include a handle portion 314 and a cam portion 316. Cam portion 316 can also be referred to as a cam body. The width of handle portion 314 can be smaller than cam portion 316 such that, when cam latch 306 is attached to the side of a guide rail, cam portion 316 can be in direct contact with the external sidewall (i.e., the sidewall facing away from the HBA card) of the guide rail, whereas handle portion 314 is not in contact with the guide rail. This arrangement can allow a user to insert a finger between handle portion 314 and the guide rail to pull handle portion 314 to rotate (e.g., in a clockwise direction) cam latch 306. For example, a user can open the top cover of the 1U IOM chassis and push or pull handle portion 314 to lock or unlock the cam-latch lock. Cam latch 306 can be made of a plastic material (e.g., polytetrafluoroethylene (PTFE), polyvinyl chloride (PVC), etc.)

Cam portion 316 can have a longer edge 340 and a shorter edge 342, and rotation center 318 of cam latch 306 can be positioned such that the distances between rotation center 318 and the two edges of cam portion 316 are different. According to one example, longer edge 340 can be 8.5 mm long, shorter edge 342 can be 5 mm long, and length 344 of handle portion 314 can be 4 mm long. Other dimensions are also possible. Note that rotation center 318 of cam latch 306 corresponds to the longitudinal axis of hinge pin 308, as cam latch 306 rotates about hinge pin 308. In the example shown in FIG. 3C, the distance between rotation center 318 and the longer edge of cam portion 316 is denoted D1, and the distance between rotation center 318 and the shorter edge of cam portion 316 is denoted D2. D1 can be smaller than D2.

For example, D1 can be about 2 mm long and D2 can be about 5 mm long. This asymmetric design of cam portion 316 facilitates the cam motion of cam latch 306. Chamfered corner 346 of cam portion 316 allows cam latch 306 to rotate about hinge pin 308 without damaging the surface of the guide rail (which can be made of plastic). According to one aspect, chamfered corner 346 can be part of a circle having a radius between 1 and 2 mm. It is also possible that chamfered corner 346 is part of an eclipse or a circle of a different size.

In the example shown in FIGS. 3A-3C, cam latch 306 can include through-holes (e.g., shown as rotation center 318) to receive hinge pin 308. In alternative aspects, instead of through-holes, the internal walls of cam latch 306 can include indents or recesses that receive hinge pin 308 such that hinge pin 308 is covered by the external walls of cam latch 306 and is not exposed.

Figure 4C:
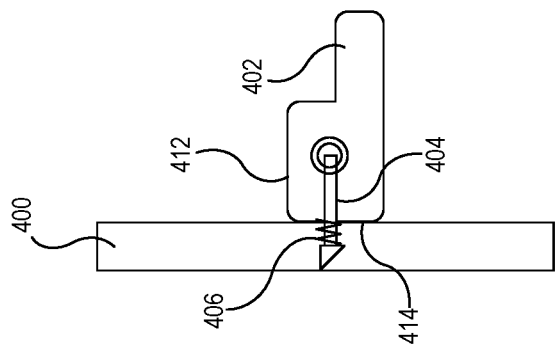
FIG. 4C illustrates the cam-latch lock in a stable unlocked state, according to one aspect of the application.
Figure 4B:
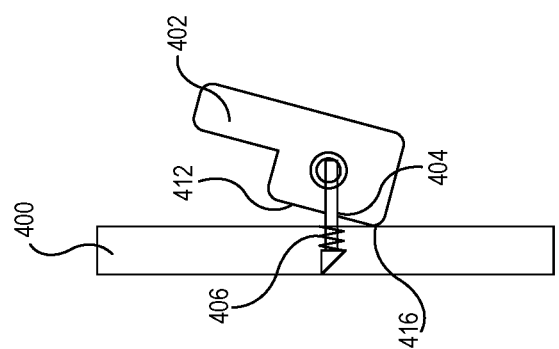
FIG. 4B illustrates the cam-latch lock in an unstable unlocked state, according to one aspect of the application.
Figure 4A:
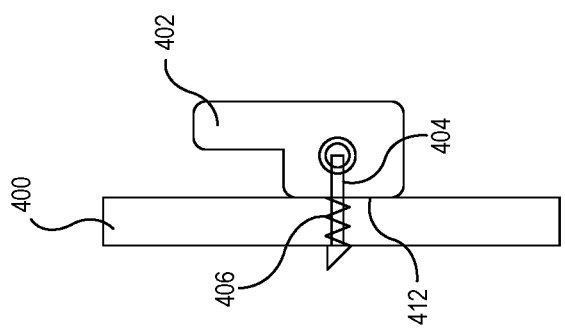
FIG. 4A illustrates the cam-latch lock in a locked state, according to one aspect of the application.

FIG. 4A illustrates the cam-latch lock in a locked state, according to one aspect of the application. More specifically, when in the locked state, longer edge 412 of the cam portion of cam latch 402 is in contact with the external side wall (the wall facing away from the circuit board) of guide rail 400. Plunger 404 is attached (e.g., via a hinge pin) to cam latch 402 and is inserted into a through-hole (not shown in FIG. 4A) on guide rail 400. The through-hole is configured such that plunger 404 can only move in a direction perpendicular to the length of guide rail 400. The dimensions of these components, including the thickness of guide rail 400, the length of the rod of plunger 404, and the distance between the hinge pin and the edge of cam latch 402, can be configured such that the lock feature of plunger 404 extends beyond the internal sidewall (the sidewall facing the circuit board) of guide rail 400. The extended lock feature can fit into the corresponding notch on the circuit board, locking the circuit board in position, as shown in FIG. 2A. FIG. 4A also shows spring 404 surrounding the rod of plunger 404. The spring can be confined between the wall of guiderail 400 and the lock feature. When the cam-latch lock is in the locked position shown in FIG. 4A, the spring is uncompressed.

FIG. 4B illustrates the cam-latch lock in an unstable unlocked state, according to one aspect of the application. More specifically, FIG. 4B shows cam latch 402 moved away from guide rail 400 such that longer edge 412 of the cam portion of cam latch 402 is no longer in contact with the external sidewall of guide rail 400. Rounded corner 416 may be pressed against guide rail 400. This movement can result from a user pulling cam latch 402 away from guide rail 400 or from the edge of the circuit board pushing the lock feature of plunger 404 while the circuit board is being inserted into the slot on the guide rails. This movement also causes the lock feature to move toward guide rail 400 (e.g., into the through-hole on guide rail 400), thus retracting from the notch on the circuit board. In this case, spring 406 is compressed by the lock feature and guide rail 400. According to one aspect, spring 406 can be compressed by a force greater than a few newtons (e.g., 5 N). The retracted lock feature no longer blocks the movement of the circuit board along the guide rails. The circuit board can be pushed in or pulled out. However, this unlocked state can be unstable, because when the external force is removed (e.g., the user stops pulling on cam latch 402 or the edge of the circuit board no longer pushes against the lock feature), compressed spring 406 can decompress and push the lock feature back into the locked position, as shown in FIG. 4A. For example, when the circuit board is pushed in position, the notch on the circuit board aligns with plunger 404, thus allowing the retracted lock feature to be pushed out by spring 406 to lock the circuit board in position. Similarly, the user may pull cam latch 402 out with one hand to retract the lock feature and use the other hand to pull out the circuit board; once the circuit board is pulled out, the user releases cam latch 402, and cam latch 402 and plunger 404 will resume their initial locked position. Spring constant of spring 406 can be carefully selected such that the user does not need to apply a large force to compress spring 406 while pulling out cam latch 402. According to one aspect, the user may apply a force of a few newtons (e.g., between 1 and 10 N) on cam latch 402 to pull out cam latch 402.

FIG. 4C illustrates the cam-latch lock in a stable unlocked state, according to one aspect of the application. More specifically, FIG. 4C shows that cam latch 402 has rotated clockwise (e.g., pulled by a user) such that shorter edge 414 of the cam portion of cam latch 402 is now in contact with the external sidewall of guide rail 400. As discussed previously, the distance between the hinge pin and shorter edge 414 of the cam portion can be greater than that of longer edge 412. Therefore, a cam effect can be created, where the rotational motion of cam latch 402 is transformed into the linear motion of plunger 404 attached to cam latch 402. In this example, rotating cam latch 402 sideways or clockwise can cause plunger 404 to move to the right, away from guide rail 400. This movement effectively pulls the lock feature toward guide rail 400 (e.g., into the through-hole on guide rail 400), thus retracting the lock feature from the notch on the circuit board. The retracted lock feature no longer blocks the movement of the circuit board along the guide rails. As shown in FIG. 4B, when the lock is in the stable unlocked position, spring 406 is compressed between the lock feature and the wall of guide rail 400. When the lock is in the stable unlocked state, shorter edge 414 of cam latch 402 is in contact with guide rail 400, thereby preventing the decompression of compressed spring 406. In other words, when cam latch 402 is rotated or pulled to the position shown in FIG. 4C, the lock feature can remain retracted, and the unlocked state can remain stable. When the cam-latch lock is in this stable unlocked state, a circuit board can move freely along the guide rails, and the user can install or uninstall the circuit board. After inserting the circuit board into the guide rails, the user can rotate or push cam latch 402 counterclockwise, back to the locked position shown in FIG. 4A.

Figure 5A:
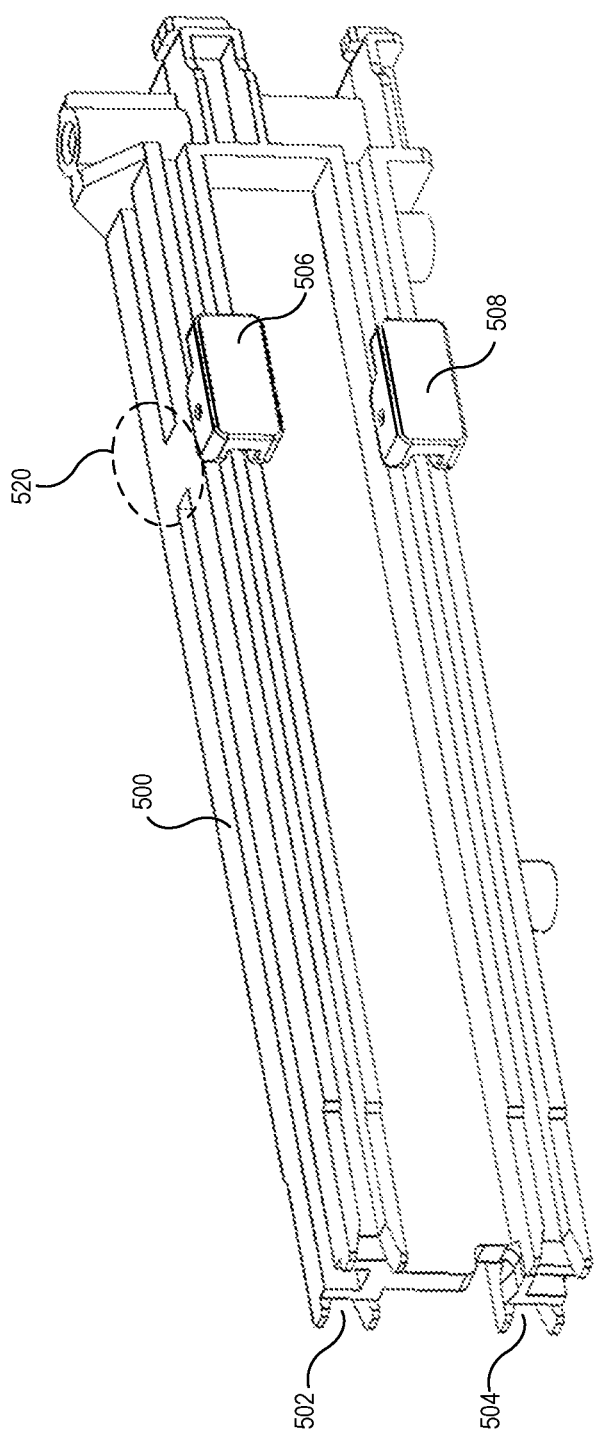
FIG. 5A illustrates a pair of cam-latch locks installed on a guide rail, according to one aspect of the instant application.

FIG. 5A illustrates a pair of cam-latch locks installed on a guide rail, according to one aspect of the instant application. In FIG. 5A, a guide rail 500 can include a pair of slots (e.g., slots 502 and 504) for receiving circuit boards, one slot per circuit board. In this example, the HBA sub-assembly can fit two HBA cards. FIG. 5A also shows a pair of cam-latch locks (e.g., locks 506 and 508) attached to the external sidewall of guide rail 500. Each lock can be attached to the side of a corresponding slot. The wall of guide rail 500 can also include thickened segments to which locks 506 and 508 are attached, as shown by a dashed circle 520. Guide rail 500, which can be made of plastic or other materials, can include additional material at location 520 to provide room to form the cavity holding the plunger of cam-latch lock 506 (the cavity and the plunger are not shown in FIG. 5A). In the example shown in FIG. 5A, cam-latch locks 506 and 508 are in the locked state, that is, their lock features are extended beyond the internal wall of guide rail 500 to lock circuit boards inserted into slots 502 and 504 in position.

Figure 5C:
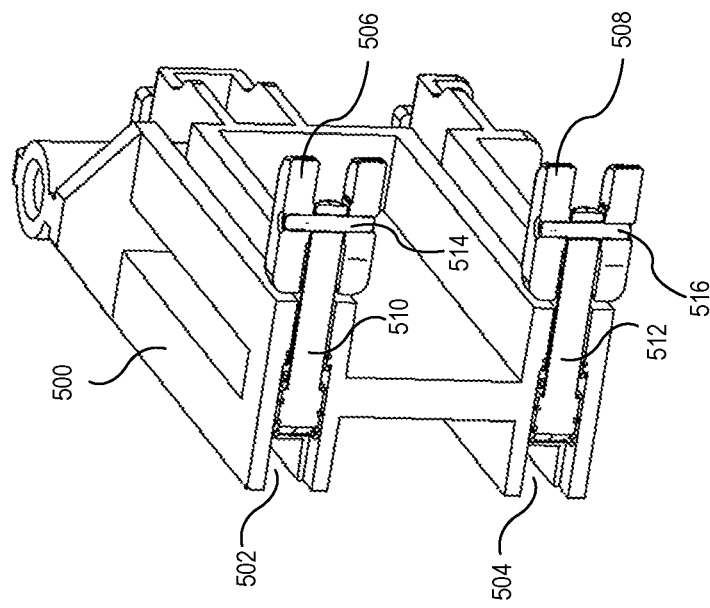
FIG. 5C illustrates the cross section of the cam-latch locks and guide rail when the locks are in the unlocked state, according to one aspect of the instant application.
Figure 5B:
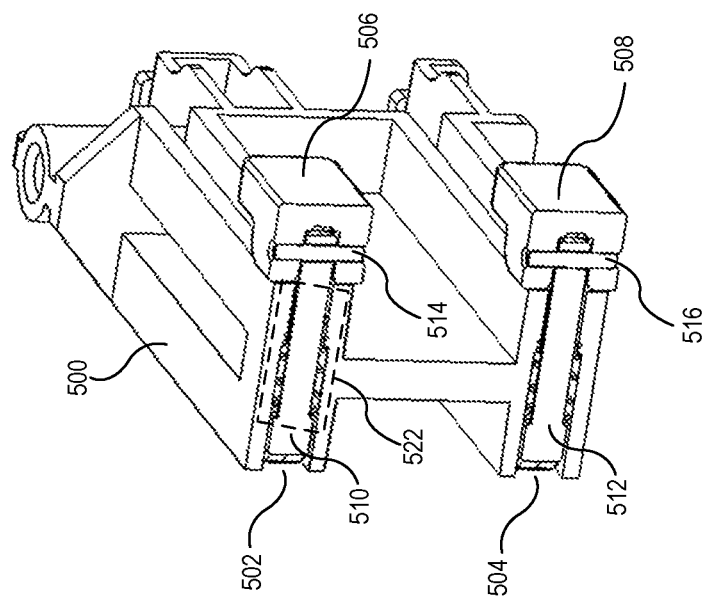
FIG. 5B illustrates the cross section of the cam-latch locks and guide rail when the locks are in the locked state, according to one aspect of the instant application.

FIG. 5B illustrates the cross section of the cam-latch locks and guide rail when the locks are in the locked state, according to one aspect of the instant application. As shown in FIG. 5B, cam-latch locks 506 and 508 are in the locked state. More specifically, plungers 510 and 512 of cam-latch locks 506 and 508 are extended into slots 502 and 504, respectively. Each plunger can be confined by a cavity 522 on guide rail 500. Cavity 522 can include a wider section to accommodate the spring and the lock feature and a narrower section confining the rod of the plunger. The narrower section prevents the plunger and spring from exiting the cavity through the external wall of guide rail 500. According to one aspect, the width of the narrower section can be between ½ and ¾ of the width of the wider section. FIG. 5B also shows that each cam-latch lock includes a hinge pin coupling the plunger and the cam latch. For example, cam-latch lock 506 includes hinge pin 514, and cam-latch lock 508 includes hinge pin 516. Note that the plunger and the hinge pin, which are perpendicular to each other, effectively attach the cam-latch lock to guide rail 500, and no additional attachment mechanism (e.g., screws) is needed.

FIG. 5C illustrates the cross section of the cam-latch locks and guide rail when the locks are in the unlocked state, according to one aspect of the instant application. In this example, cam-latch locks 506 and 508 are in the stable unlocked state, where their cam latches have been pulled (or rotated) sideways. Consequently, the plungers are retracted from the slots on guide rail 500. For example, plunger 510 is retracted from slot 502, and plunger 512 is retracted from slot 504. FIG. 5C also shows that each spring can be compressed between the lock feature (which is wider than the rod of the plunger) and the narrower section of the cavity. However, because the shorter edge of the cam latch is in contact with the external sidewall of guide rail 500, the plunger is prevented from being pushed toward the circuit board by the compressed spring.

Figure 6A:
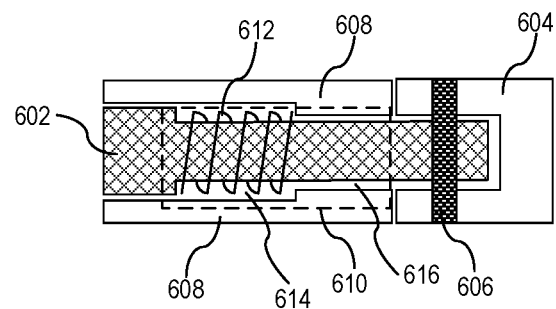
FIG. 6A illustrates a cross-sectional view of the cam-latch lock in the locked state, according to one aspect of the instant application.

FIG. 6A illustrates a cross-sectional view of the cam-latch lock in the locked state, according to one aspect of the instant application. More specifically, FIG. 6A shows a plunger 602 and a cam latch 604 being coupled to each other by a hinge pin 606. Cam latch 604 can be positioned adjacent to a guide rail 608, facing away from the side of guide rail 608 that receives circuit boards. Plunger 602 can be inserted into a cavity 610 formed on guide rail 608. Cavity 610 can have a wider section 614 to accommodate a widened segment (i.e., the lock feature) of plunger 602 and a spring 612 and a narrower section 616. In the example shown in FIG. 6A, the cam-latch lock is in the locked state, where plunger 602 is fully extended to the left or the internal edge of guide rail 608. As discussed previously, the fully extended plunger can engage with a notch on a circuit board inserted into a slot on guide rail 608, locking the circuit board in position. In this case, spring 612 is uncompressed.

Figure 6B:
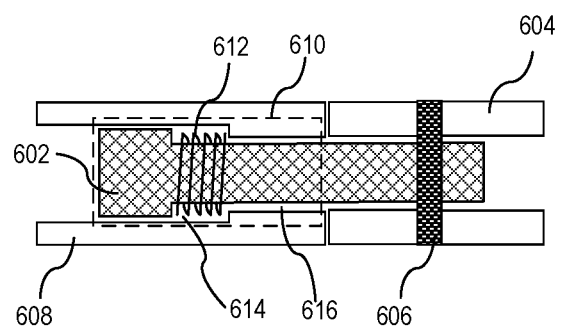
FIG. 6B illustrates a cross-sectional view of the cam-latch lock in the unlocked state, according to one aspect of the instant application.

FIG. 6B illustrates a cross-sectional view of the cam-latch lock in the unlocked state, according to one aspect of the instant application. In the example shown in FIG. 6B, cam latch 604 is rotated (in a direction pointing toward the viewer) such that its shorter edge is in contact with guide rail 608. When cam latch 604 is in this position, hinge pin 606 can move further away from guide rail 608, thereby pulling plunger 602 to the right and unlocking the circuit board. In this case, spring 612 can remain compressed until cam latch 604 rotates back to the unlocked position.

As can be seen from FIGS. 6A-6B, installing a cam-latch lock can include placing spring 612 around the rod of plunger 602; inserting, from the circuit-board-facing side of guide rail 608, the rod of plunger 602 into cavity 610 (note that one may need to compress spring 612 to ensure that a significant amount of the rod exits cavity 610); attaching hinge pin 606 to plunger 602; and then attaching cam latch 604 to hinge pin 606.

In general, this disclosure describes a solution to the problem of locking hot swappable circuit boards that are stacked on top of each other. More specifically, a cam-latch-based locking mechanism can be used, where a rotational motion of the cam latch is transformed into a linear motion of a plunger coupled to the cam latch. The linear motion of the plunger locks and unlocks a circuit board held between a pair of guide rails. Due to constraints in vertical clearance, the cam-latch lock is attached to the side of the guide rail, and the plunger of the lock engages with the circuit board from the side (e.g., the plunger moves in a plane parallel to the component-mounting surface of the circuit board). One cam-latch lock can be used for each circuit board. Throughout this disclosure, OCP HBA cards have been used as examples when describing the operation principles of the cam-latch locks. In practice, such side-mounted cam-latch locks can be used to lock any type of circuit board, as long as the circuit board includes a predefined notch to allow the lock feature of the cam-latch lock to engage with the circuit board. For example, the OCP HBA card has two symmetric notches on opposite edges, whereas a different type of circuit board may have an asymmetric arrangement of notches (e.g., it may only have one notch in total or may have more than one notch on one edge). It is also possible to use more than one (e.g., two) cam-latch locks mounted on the side of the guide rails to lock the circuit board. In addition, FIGS. 5A-5C show the guide rails accommodating two stacked circuit boards. In practice, fewer (e.g., one) or more (e.g., four) circuit boards may be held between the pair of guide rails, and a corresponding number of cam-latch locks can then be used to lock these circuit boards in position.

One aspect of the instant application provides an apparatus for locking a circuit board in position. The apparatus can include a cam latch, a plunger, and a hinge pin coupling the cam latch and the plunger. The cam latch is positioned to rotate around the hinge pin, and the rotation of the cam latch causes a linear motion of the plunger in a plane parallel to a component-mounting surface of the circuit board, thereby facilitating locking and unlocking of the circuit board.

In a variation on this aspect, the plunger is to engage with a notch on the circuit board to lock the circuit board in position.

In a further variation, the plunger is to engage with the notch via a through-hole positioned on a guide rail for holding the circuit board.

In a further variation, the rotation of the cam latch causes the plunger to extend into the notch to lock the circuit board in position or retract from the notch to unlock the circuit board.

In a variation on this aspect, the cam latch comprises a handle and a body, wherein the body comprises a shorter edge and a longer edge.

In a further variation, the circuit board is locked between a pair of guide rails when the cam latch rotates to a position where the longer edge of the body is against a first guide rail, and the circuit board is unlocked between the pair of guide rails when the cam latch rotates to a position where the shorter edge of the body is against the first guide rail.

In a variation on this aspect, an end of the plunger can include a slanted surface such that, when the circuit board is pushed along a pair of guide rails, an edge of the circuit board is to push the plunger from a locked position to an unlocked position.

In a further variation, the apparatus can further include a spring surrounding the plunger. The spring is uncompressed when the plunger is in the locked position and compressed when the plunger is in the unlocked position.

In a variation on this aspect, the plunger can include metal (e.g., die-cast aluminum, die-cast zinc, etc.) and the cam latch can include plastic (e.g., polytetrafluoroethylene (PTFE) and polyvinyl chloride (PVC)).

One aspect of the instant application provides a circuit board enclosure. The circuit board enclosure can include a pair of guide rails configured to hold one or more circuit boards, with a respective circuit board comprising a notch on an edge adjacent to a first guide rail, and at least one cam-latch lock attached to the first guide rail. The cam-latch lock is configured to lock the circuit board in position. The cam-latch lock can include a cam latch, a plunger, and a hinge pin coupling the cam latch and the plunger. The cam latch is positioned to rotate around the hinge pin, and the rotation causes a linear motion of the plunger in a plane parallel to a component-mounting surface of the circuit board, thereby facilitating locking and unlocking of the circuit board.

The foregoing descriptions have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. An apparatus for locking a circuit board in position, the apparatus comprising:
    a guide rail comprising:
        a slot disposed extending along a first dimension and configured to receive an edge of a circuit board inserted therein; and
        a through-hole extending along a second dimension through the guide rail and into the slot, the second dimension perpendicular to the first dimension;
    a cam-latch lock attached to the guide rail and comprising:
        a cam latch;
        a plunger extending through the through-hole; and
        a hinge pin coupling the cam latch and the plunger;
    wherein the cam latch is positioned to rotate around the hinge pin, and wherein the rotation causes a linear motion of the plunger within the through-hole parallel to the second dimension between an extended position and a retracted position, wherein in the extended position the plunger protrudes into the slot to engage the circuit board to lock the circuit board in position, and wherein in the retracted position the plunger is retracted from the slot and unlocks the circuit board.

2. The apparatus of claim 1, wherein the plunger is to engage with a notch in the edge of the circuit board to lock the circuit board in position.

3. The apparatus of claim 2, wherein the rotation of the cam latch causes the plunger to extend into the notch to lock the circuit board in position or retract from the notch to unlock the circuit board.

4. The apparatus of claim 1, wherein the cam latch comprises a handle and a body, and wherein the body comprises a shorter edge and a longer edge.

5. The apparatus of claim 4, wherein the circuit board is locked between a pair of guide rails when the cam latch rotates to a position where the longer edge of the body is against a first guide rail, and wherein the circuit board is unlocked between the pair of guide rails when the cam latch rotates to a position where the shorter edge of the body is against the first guide rail.

6. The apparatus of claim 1, wherein an end of the plunger comprises a head with a slanted surface configured such that, on condition of the plunger being in the extended position while the circuit board is being inserted into the slot, an edge of the circuit board contacts the slanted surface and pushes the plunger from the extended position to the retracted position, the slanted surface converting the translation of the circuit board parallel to the first dimension into translation of the plunger parallel to the second dimension.

7. The apparatus of claim 6, further comprising a spring surrounding the plunger and retained between the guide rail and the head of the plunger, wherein the spring is configured to urge the plunger towards the extended position.

8. The apparatus of claim 1, wherein the plunger comprises metal, and wherein the cam latch comprises plastic.

9. A circuit board enclosure, comprising:
    a pair of guide rails configured to hold a circuit board, wherein each of the guide rails comprises a slot extending along a first dimension and configured to receive an edge of the circuit board, wherein a first guide rail of the pair of guide rails comprises a through-hole extending along a second dimension through the first guide rail and into the slot of the first guide rail, the second dimension perpendicular to the first dimension; and
    a cam-latch lock attached to the first guide rail, wherein the cam-latch lock is to lock the circuit board in position, and wherein the cam-latch lock comprises:
        a cam latch;
        a plunger extending through the through-hole; and
        a hinge pin coupling the cam latch and the plunger;
        wherein the cam latch is positioned to rotate around the hinge pin, and
    wherein the rotation causes a linear motion of the plunger within the through-hole parallel to the second dimension between an extended position and a retracted position, wherein in the extended position the plunger protrudes into the slot to engage the circuit board to lock the circuit board in position, and wherein in the retracted position the plunger is retracted from the slot and unlocks the circuit board.

10. The circuit board enclosure of claim 9, wherein the plunger is configured to engage with a notch in one of the edges of the circuit board to lock the circuit board in position.

11. The circuit board enclosure of claim 9, wherein the rotation of the cam latch causes the plunger to extend into the notch to lock the circuit board in position or retract from the notch to unlock the circuit board.

12. The circuit board enclosure of claim 9, wherein the cam latch comprises a handle and a body, and wherein the body comprises a shorter edge and a longer edge.

13. The circuit board enclosure of claim 12, wherein the circuit board is locked between the pair of guide rails when the cam latch rotates to a position where the longer edge of the body is against the first guide rail, and wherein the circuit board is unlocked between the pair of guide rails when the cam latch rotates to a position where the shorter edge of the body is against the first guide rail.

14. The circuit board enclosure of claim 9, wherein an end of the plunger comprises a head with a slanted surface configured such that, on condition of the plunger being in the extended position while the circuit board is being inserted into the slot, the edge of the circuit board contacts the slanted surface and pushes the plunger from the extended position to the retracted position, the slanted surface converting the translation of the circuit board parallel to the first dimension into translation of the plunger parallel to the second dimension.

15. The circuit board enclosure of claim 14, wherein the cam-latch lock further comprises a spring surrounding the plunger and retained between the guide rail and the head of the plunger, wherein the spring is configured to urge the plunger towards the extended position.

16. The circuit board enclosure of claim 9, wherein the plunger comprises metal, and wherein the cam latch comprises plastic.

17. The circuit board enclosure of claim 9, wherein the pair of guide rails is configured to hold multiple stacked Open Compute Project (OCP) host bus adaptor (HBA) boards.

18. The circuit board enclosure of claim 9, wherein the pair of guide rails comprise multiple slots to hold multiple vertically stacked circuit boards, and wherein the enclosure comprises multiple cam-latch locks, each cam-latch lock to lock/unlock a corresponding circuit board.

* * * * *